(12) United States Patent
Kobayashi et al.

(10) Patent No.: US 11,192,282 B2
(45) Date of Patent: Dec. 7, 2021

(54) TEMPLATE, TEMPLATE MANUFACTURING METHOD, AND SEMICONDUCTOR DEVICE MANUFACTURING METHOD

(71) Applicant: TOSHIBA MEMORY CORPORATION, Tokyo (JP)

(72) Inventors: Kei Kobayashi, Yokohama Kanagawa (JP); Anupam Mitra, Yokohama Kanagawa (JP); Seiji Morita, Tokyo (JP); Hirokazu Kato, Kariya Aichi (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 453 days.

(21) Appl. No.: 16/116,402

(22) Filed: Aug. 29, 2018

(65) Prior Publication Data

US 2019/0263024 A1    Aug. 29, 2019

(30) Foreign Application Priority Data

Feb. 27, 2018    (JP) .............................. JP2018-033833

(51) Int. Cl.
| | |
|---|---|
| B29C 33/42 | (2006.01) |
| B29C 35/08 | (2006.01) |
| G03F 7/00 | (2006.01) |
| B29C 37/00 | (2006.01) |
| H01L 21/027 | (2006.01) |
| B29C 43/02 | (2006.01) |
| B29C 43/38 | (2006.01) |

(52) U.S. Cl.
CPC ........ *B29C 33/424* (2013.01); *B29C 35/0888* (2013.01); *B29C 37/0053* (2013.01); *B29C 43/021* (2013.01); *B29C 43/38* (2013.01); *G03F 7/0002* (2013.01); *H01L 21/027* (2013.01); *B29C 2035/0827* (2013.01); *B29C 2043/025* (2013.01)

(58) Field of Classification Search
CPC ..... B29C 33/424; B29C 43/021; B29C 43/38; B29C 35/0888; G03F 7/0002
See application file for complete search history.

(56) References Cited

U.S. PATENT DOCUMENTS

| | | | |
|---|---|---|---|
| 7,374,417 B2 | 5/2008 | Kuwabara et al. | |
| 7,473,090 B2 * | 1/2009 | McMackin | B82Y 10/00 425/385 |
| 8,016,585 B2 | 9/2011 | Komoriya et al. | |
| 8,096,802 B2 | 1/2012 | Mori et al. | |

(Continued)

FOREIGN PATENT DOCUMENTS

| | | |
|---|---|---|
| EP | 1731961 B1 | 11/2008 |
| JP | 2004299153 A | 10/2004 |

(Continued)

*Primary Examiner* — Galen H Hauth
(74) *Attorney, Agent, or Firm* — Kim & Stewart LLP (57) ABSTRACT

According to one embodiment, a template for imprint patterning processes comprises a template substrate having a first surface and a pedestal on the first surface of the template substrate, the pedestal having a second surface spaced from the first surface in a first direction perpendicular to the first surface. A pattern is disposed on the second surface. The pedestal has a sidewall between the first surface and the second surface that is at an angle of less than 90° to the second surface.

16 Claims, 10 Drawing Sheets

(56) References Cited

U.S. PATENT DOCUMENTS

| | | | |
|---|---|---|---|
| 8,636,498 B2* | 1/2014 | Tsuji | G03F 7/0002 |
| | | | 425/385 |
| 9,349,918 B2 | 5/2016 | Kashima et al. | |
| 2010/0092599 A1* | 4/2010 | Selinidis | G03F 9/708 |
| | | | 425/470 |
| 2010/0092727 A1* | 4/2010 | Uchida | B29C 33/424 |
| | | | 428/142 |
| 2011/0008577 A1 | 1/2011 | Miyake et al. | |
| 2012/0040041 A1 | 2/2012 | Tsuji et al. | |
| 2013/0134445 A1* | 5/2013 | Tarsa | G02B 19/0066 |
| | | | 257/88 |
| 2016/0346962 A1 | 12/2016 | Kawamura et al. | |
| 2017/0040161 A1 | 2/2017 | Sato | |
| 2017/0173852 A1* | 6/2017 | Moore | H01L 33/0095 |

FOREIGN PATENT DOCUMENTS

| | | |
|---|---|---|
| JP | 2007055235 A | 3/2007 |
| JP | 2007283674 A | 11/2007 |
| JP | 2009119695 A | 6/2009 |
| JP | 2010049745 A | 3/2010 |
| JP | 2012039012 A | 2/2012 |
| JP | 2012121213 A | 6/2012 |
| JP | 2012195599 A | 10/2012 |
| JP | 5117318 B2 | 1/2013 |
| JP | 2013016734 A | 1/2013 |
| JP | 2013030522 A | 2/2013 |
| JP | 2013110135 A | 6/2013 |
| JP | 5315513 B2 | 10/2013 |
| JP | 2015041742 A | 3/2015 |
| JP | 2016174150 A | 9/2016 |
| JP | 2016225370 A | 12/2016 |

* cited by examiner

TEMPLATE, TEMPLATE MANUFACTURING METHOD, AND SEMICONDUCTOR DEVICE MANUFACTURING METHOD

CROSS-REFERENCE TO RELATED APPLICATION

This application is based upon and claims the benefit of priority from Japanese Patent Application No. 2018-033833, filed Feb. 27, 2018, the entire contents of which are incorporated herein by reference.

FIELD

Embodiments described herein relate generally to a template, a template manufacturing method, and a semiconductor device manufacturing method.

BACKGROUND

In the related art, when a template is pressed against a resist material on a workpiece during imprint lithography processing, the resist material seeps out from a periphery of a pedestal portion of the template on which the imprint pattern is disposed.

DETAILED DESCRIPTION

Embodiments provide an imprint template, an imprint template manufacturing method, and a semiconductor device manufacturing method using an imprint template which can prevent a resist from seeping out from a periphery of a pedestal portion of the template during the imprint processing.

In general, according to one embodiment, a template for imprint patterning processes comprises a template substrate having a first surface and a pedestal on the first surface of the template substrate. The pedestal has a second surface spaced from the first surface of the template substrate in a first direction perpendicular (normal) to the first surface. A pattern is disposed on the second surface. The pedestal has a sidewall between the first surface and the second surface that is at an angle of less than 90° to the second surface.

A template, a template manufacturing method, and a semiconductor device manufacturing method according to example embodiments will be hereinafter described in detail with reference to the accompanying drawings. It is noted that the present disclosure is not limited by these example embodiments.

First Embodiment

Figure 1A:
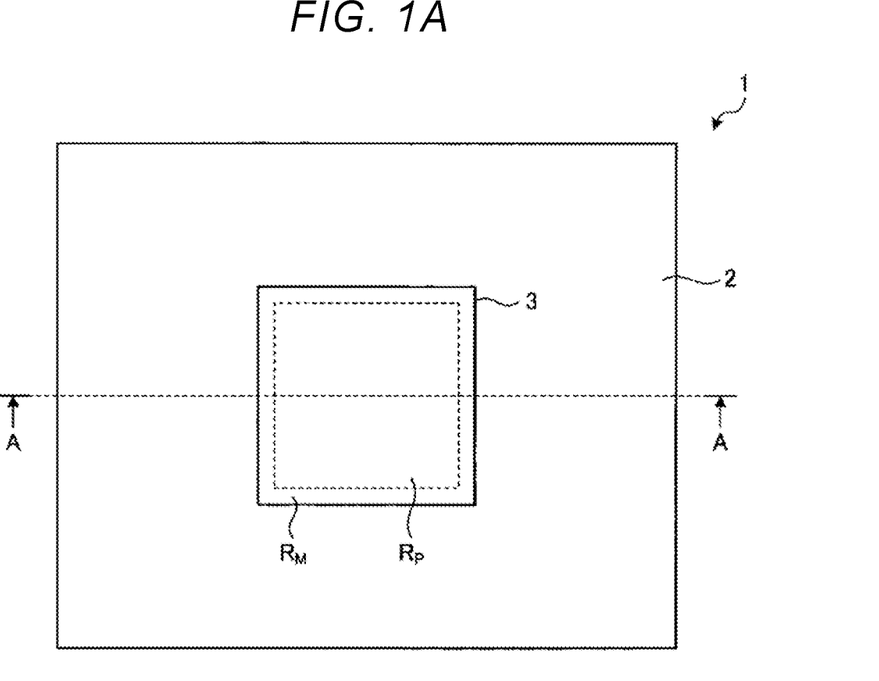
FIGS. 1A and 1B are views schematically illustrating a template according to a first embodiment.
Figure 1B:
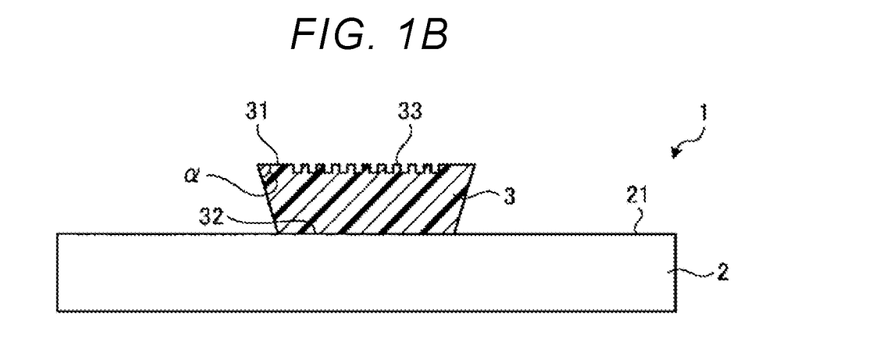

FIGS. 1A and 1B are views schematically illustrating an example configuration of a template according to a first embodiment. FIG. 1A is a top view, and FIG. 1B is a cross-sectional view taken along a line A-A of FIG. 1A. A template 1 includes a rectangular template substrate 2 and a pedestal portion 3 provided on (or approximately so) a central portion of a first surface 21 of template substrate 2.

The template substrate 2 has, for example, a generally rectangular flat plate structure. The template substrate 2 is formed of quartz glass or the like.

The pedestal portion 3 has a quadrangular pyramidal structure. An uneven pattern 33 that is to be brought into contact with a resist on a workpiece during the imprint processing is provided on a first surface 31 of the pedestal portion 3. A pattern arrangement region $R_p$ and a mark arrangement region $R_M$ provided on an outer periphery of the pattern arrangement region $R_p$ are provided on the first surface 31. In FIG. 1A, the pattern arrangement region $R_p$ is rectangular, and the mark arrangement region $R_m$ surrounds the pattern arrangement region $R_p$ in a rectangular frame-like manner. A pattern, corresponding to a wiring pattern or other device components, to be transferred to the workpiece is formed in the pattern arrangement region $R_p$. Marks, particularly alignment marks for aligning the template 1 with the workpiece are disposed in the mark arrangement region $R_M$.

A second surface 32 of the pedestal portion 3 adheres to the first surface 21 of the template substrate 2. The pedestal portion 3 is formed of resin such as urethane rubber, silicone rubber, or acrylate-based rubber. In addition, a thickness of the pedestal portion 3 is not limited in particular; however, in some examples, it is preferable that the thickness is approximately 10 μm to 20 μm.

The second surface 32 is smaller (in projected surface area) than the first surface 31. Accordingly, side surfaces other than the first surface 31 and the second surface 32 of the pedestal portion 3 are angled from the second surface 32 toward the first surface 31. That is, an angle α formed between the first surface 31 and a side surface of the pedestal portion 3 is an acute angle (less than 90 degrees). It is noted that the angle α is more preferably greater than or equal to 30 degrees and is less than or equal to 45 degrees. As such, by configuring the corner portion on the first surface 31 side as an acute angle, the resist is not extruded outward from the first surface 31, even if the resist reaches a peripheral edge portion of the pedestal portion 3 when the template 1 is pressed against the resist on the workpiece in the imprint processing. That is, it is possible to prevent the resist from flowing along the side surface of the pedestal portion 3 during imprint processing.

Figure 2A:
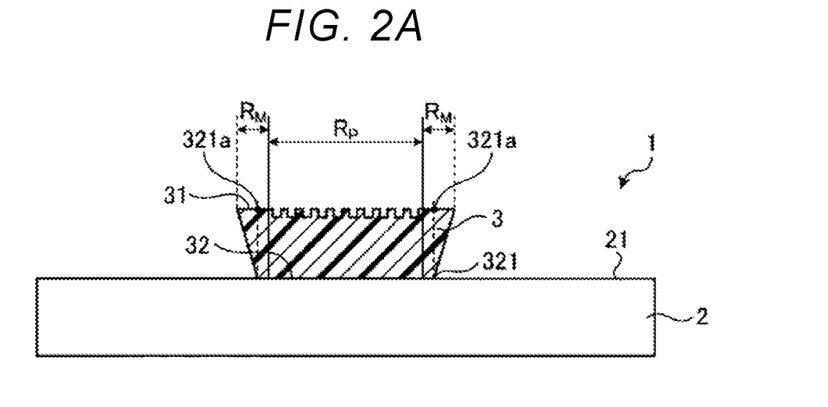
FIGS. 2A and 2B are cross-sectional views illustrating additional aspects of the template according to a first embodiment.
Figure 2B:
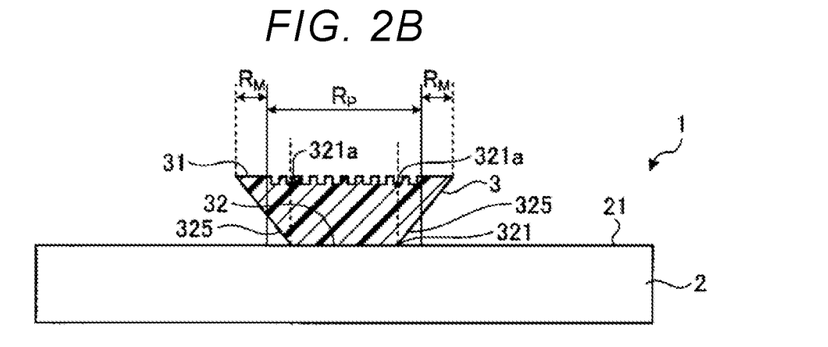

FIGS. 2A and 2B illustrate an example of a configuration of the template according to the first embodiment. The more acute the angle α of the corner portion on the first surface 31 side is, the more the resist can be prevented from being extruded to the side surface of the pedestal portion 3. However, as the angle α of the corner portion is reduced, an outer edge 321 of the second surface 32 moves further towards the center of the pedestal portion 3. In FIG. 2A, a projected position 321a (a perpendicular line drawn from the outer edge 321 of the second surface 32 towards the first surface 31) of the outer edge 321 is within the mark arrangement region $R_M$ (or alternatively described as outside the pattern arrangement region $R_p$). However, in FIG. 2B, the position 321a is within the pattern arrangement region $R_p$. That is, for the arrangement depicted FIG. 2A, the full, maximum thickness of pedestal portion 3 is below all portions of the pattern arrangement region $R_p$. However, for the arrangement depicted in FIG. 2B, there is a region 325 in which the full, maximum thickness the pedestal portion 3 is not provided below a portion of the pattern arrangement region $R_p$. Here, the "outer edge" refers to an outer perimeter boundary of the second surface 32 at the interface with surface 21.

In the imprint processing, it is preferable that force is applied as uniformly as possible in places where the template pattern exists. Accordingly, for the case illustrated in FIG. 2A, a more uniform force is applied to the resist contacting the pattern arrangement region $R_p$ as compared to the case illustrated in FIG. 2B, in which the region 325 is present below a portion of the pattern arrangement region $R_p$ and the force applied to the resist by the template 1 may be different at a position corresponding to the region 325.

Therefore, it is preferable that the pedestal portion 3 exists at a uniform thickness below all portions of the pattern arrangement region $R_p$, as illustrated in FIG. 2A. Accordingly, it is preferable that the angle α of the corner portion on the first surface 31 side be selected such that the position 321a will be in the mark arrangement region $R_M$ and not pattern arrangement region $R_p$.

Figure 3A:
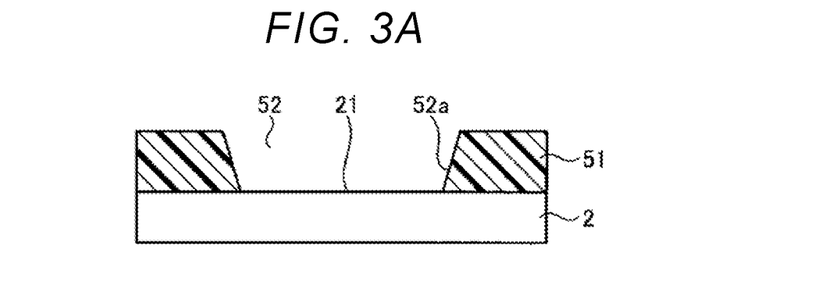
FIGS. 3A to 3E illustrate aspects of a sequence of a manufacturing method of a template according to a first embodiment.

Next, a method of manufacturing the template 1 will be described. FIGS. 3A to 3E illustrate an example of a sequence of the manufacturing method of a template 1 according to the first embodiment. First, as illustrated in FIG. 3A, the template substrate 2 is prepared. The template substrate 2 is formed of, for example, quartz glass in a form of a rectangular flat plate. Subsequently, a guide layer 51 is formed on the first surface 21 of the template substrate 2. The guide layer 51 is formed on the first surface 21 of the template substrate 2 so as to have an opening 52 having a rectangular shape in an overhead view, in which a width decreases from an upper surface of the guide layer 51 toward a lower surface (a boundary with the template substrate 2) of the guide layer 51. Here, the width indicates, for example, a maximum width of the opening 52 in any direction parallel to first surface 21. A side surface 52a forming the opening 52 has a tapered shape. The guide layer 51 is a material with etching selectivity different from etching selectivity of an embedded material 34. In addition, it is preferable that the guide layer 51 is a material that does not substantially intermix with the embedded material 34 and can be removed by a solvent. For example, polystyrene, polyurethane or the like which is a chain polymer material can be used as the guide layer 51.

The opening 52 in the guide layer 51 can be formed, for example, by an imprinting process performed on the first surface 21 of the template substrate 2, using an imprint template (e.g., a different template 1) having a rectangular convex pattern which is pressed into a material of the guide layer 51. Alternatively, the guide layer 51 and opening 52 can be formed by a photolithographic process. At this time, the angle between the upper surface and the side surface of the guide layer 51 is formed so as to be larger than 90 degrees. That is, the interior angle of the side surface of the guide layer 51 and the first surface 21 of the template substrate 2 is less than 90 degrees.

Figure 3B:
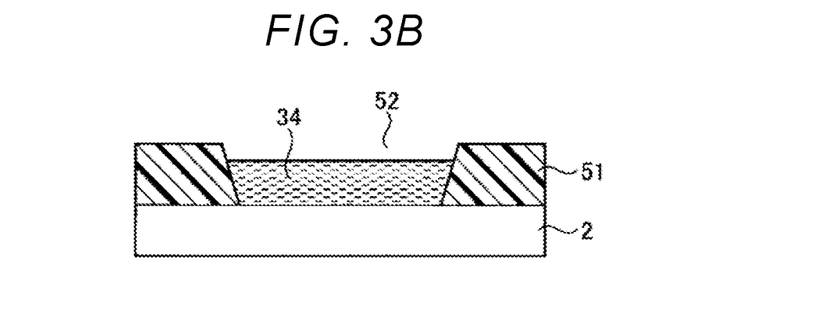

Thereafter, the embedded material 34 is disposed in the opening 52 as illustrated in FIG. 3B. The embedded material 34 is a thermosetting resin or a photo-curing resin which, as initially applied, is unset/uncured to at least some extent. The embedding material 34 is, for example, a resin material that crosslinks such as urethane rubber, silicone rubber, or acrylate-based rubber. In a state depicted in FIG. 3B, the embedded material 34 is not cured and is in a liquid or flowable state.

Figure 3C:
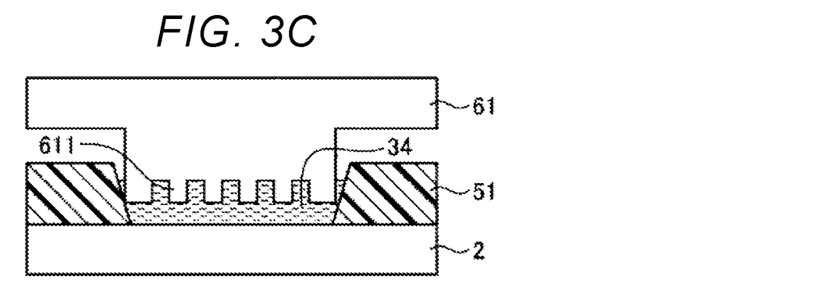

Next, as illustrated in FIG. 3C, an original plate 61 is pressed against the embedded material 34, and a recess portion 611 of the original plate 61 is filled with the embedded material 34. Thereafter, heat or light is applied to the embedded material 34, and thereby, the embedded material 34 is cured. By doing so, the embedded material 34 becomes the pedestal portion 3. The original plate 61 is a template for pattern formation having a pattern of protrusions and recesses formed thereon which is the inverse of the pattern of protrusions and recesses to be formed on template 1. The original plate 61 is formed of, for example, quartz glass and may be referred to as a master template 61 in some contexts.

Figure 3D:
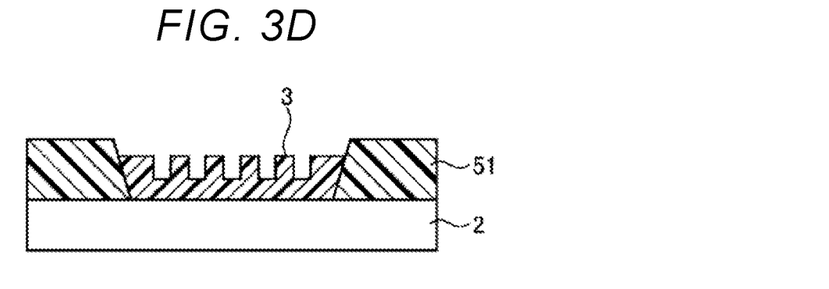
Figure 3E:
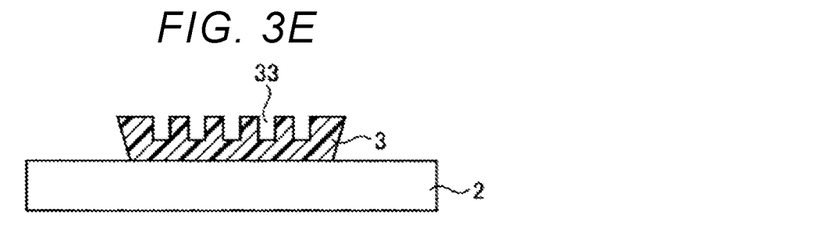

Next, as illustrated in FIG. 3D, the original plate 61 is detached from the pedestal portion 3. Furthermore, as illustrated in FIG. 3E, the guide layer 51 is removed by wet processing or the like. In the wet processing, a chemical solution or solvent in which the cured embedded material 34 does not dissolve but in which the guide layer 51 does dissolve or otherwise is removed is used. Thereby, the pedestal portion 3 having the uneven pattern 33 is formed on the template substrate 2, and the template 1 is completed.

In the first embodiment, the angle α between the first surface 31 on which the pattern of the pedestal portion 3 of the template 1 is formed and the side surface is less than 90 degrees. As a result, when the template 1 is pressed against the resist on the workpiece, it is possible to prevent or limit the resist from seeping out from the peripheral edge portion of the pedestal portion 3 and then flowing along the side surface of the pedestal portion 3. As a result, a height of the resist seeping out to the side surface of the pedestal portion 3 can be less than, for example, 100 nm. In addition, defect in a shot region formed when the next shot region is pressed can be reduced by the cured resist.

Second Embodiment

In the first embodiment, the angle α formed between a side surface and a first surface on which a pattern of a pedestal portion is formed is less than 90 degrees. As the angle α decreases, resist can be prevented from seeping out to the side surface of the template 1, but in a structure of the first embodiment, as described with reference to FIG. 2B, a pattern arrangement region has to be provided within a projected perimeter (outline) of the second surface of the pedestal portion. Accordingly, when the angle α is reduced, a width of a kerf region has to increase to make an area of the first surface of the pedestal portion to be larger than a shot region. In the second embodiment, a template capable of preventing a resist from seeping from a peripheral edge portion of the pedestal portion while keeping an area of the pedestal portion substantially the same size as the shot region will be described.

Figure 4:
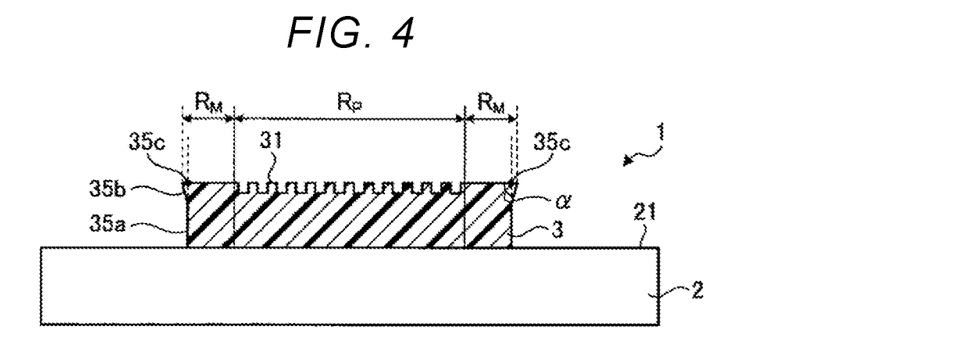
FIG. 4 is a cross-sectional view schematically illustrating one example of a template according to a second embodiment.

FIG. 4 is a sectional view schematically illustrating an example of a configuration of a template 1 according to the second embodiment. In the second embodiment, a side surface of the pedestal portion 3 is configured to have two distinct portions. A first side surface portion 35a has a surface substantially perpendicular to the first surface 21, and a second side surface portion 35b intersects at an angle α less than 90 degrees with respect to the first surface 31 are provided.

Since the angle α between the second side surface portion 35b and the first surface 31 is less than 90 degrees, as a distance from the first surface 21 increases, a position of an outer edge of the second side surface portion 35b moves. In addition, if a size (hereinafter, referred to as a height) of the pedestal portion 3 in a thickness direction is constant, the angle α formed between the first surface 31 and the second side surface portion 35b can be changed by changing the length of the first side surface portion 35a. That is, the greater the length of the first side surface portion 35a is, the smaller the angle α will be, and the shorter the length of the first side surface portion 35a, the larger the angle α is.

A position 35c, corresponding to the projected outer edge position of the first side surface portion 35a, is not located in the pattern arrangement region $R_p$ provided on the first surface 31 but is located in the mark arrangement region $R_M$. This is because, if the projected position of the outer edge of the first side surface portion 35a is in the pattern arrangement region $R_p$, it is impossible to uniformly apply a force to each position of the resist in contact with the pattern arrangement region $R_p$, as described in the first embodiment. It is noted that the same configuration elements as the configuration elements of the first embodiment are denoted by the same reference numerals or symbols, and description thereof will be omitted.

The template 1 of the second embodiment can be manufactured by substantially the same manufacturing method as the manufacturing method described in conjunction with the first embodiment. However, the side surface 52a of the opening 52 of the guide layer 51 formed on the template substrate 2 (see FIG. 3A) would need to be modified from the first embodiment to include a part corresponding to the first side surface portion 35a and a part corresponding to the second side surface portion 35b.

Figure 5:
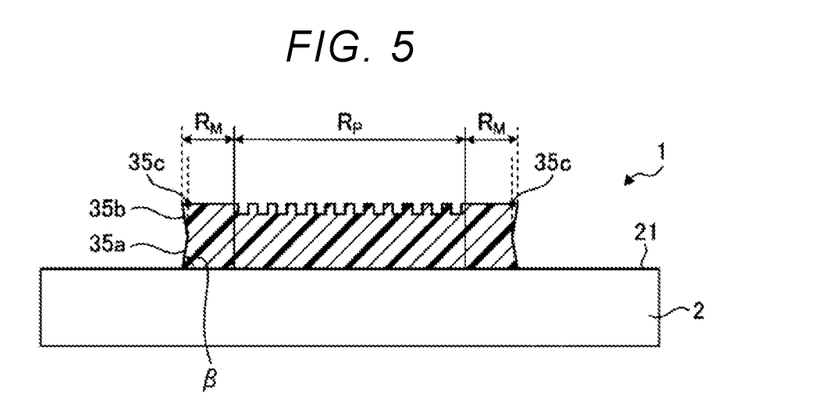
FIG. 5 is a cross-sectional view schematically illustrating another example of a template according to a second embodiment.

FIG. 5 is a sectional view schematically illustrating another example of the structure of a template 1 according to the second embodiment. In FIG. 4, a case where the first side surface portion 35a of the pedestal portion 3 stands perpendicularly to the first surface 21 is illustrated. However, as illustrated in FIG. 5, an interior angle β between the first surface 21 and the first side surface portion 35a may be less than 90 degrees. However, the position 35c (that is, the position of closest approach to the pattern arrangement region $R_p$) where the outline of the first side surface portion 35a is the smallest is projected onto the first surface 31 of the pedestal portion 3 exists in the mark arrangement region $R_M$. In addition, while not specifically illustrated, the angle β formed between the first surface 21 of the template substrate 2 and the first side surface portion 35a of the pedestal portion 3 may instead be larger than 90 degrees in some embodiments. Furthermore, the first side surface portion 35a may have a surface (R surface) with a curvature (radius of curvature) or may have another surface shape.

According to the second embodiment, substantially the same effects as the first embodiment can be obtained.

Third Embodiment

In the first embodiment, a pattern on template 1 is formed by pressing an original template into an embedded material and curing the embedded material. However, the disclosure is not limited to this. In the third embodiment, another method of manufacturing a template will be described.

Figure 6A:
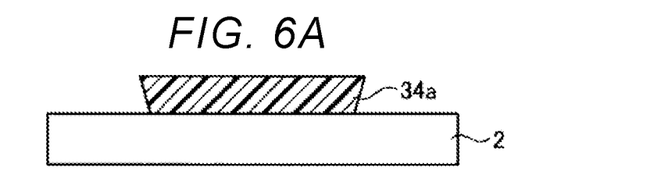
FIGS. 6A to 6D illustrate aspects of a sequence of a manufacturing method of a template according to a third embodiment.

FIGS. 6A to 6D are sectional views illustrating an example of a sequence of a manufacturing method of a template according to the third embodiment. As an initial step a process similar to those described in conjunction with FIGS. 3A and 3B in the first embodiment is performed. As such, the embedded material 34 is cured by applying heat or light to the embedded material 34 buried in the opening 52 of the guide layer 51. Then, the guide layer 51 is removed. By doing so, an embedded portion 34a formed of a resin is formed on the template substrate 2, as depicted in FIG. 6A. The embedded portion 34a corresponds to a pedestal portion 3 on which the pattern 33 has not been formed.

Figure 6B:
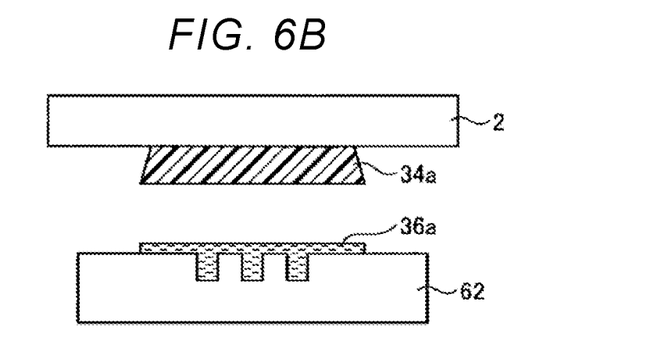

Next, as illustrated in FIG. 6B, an original plate 62 on which a pattern has been formed is coated with a receiver material 36a. The receiver material 36a is applied onto the original plate 62 by using, for example, a spin coating method. The receiver material 36a is filled into a recess pattern in the original plate 62. The original plate 62 is a template for pattern formation having a pattern on one side. The original plate 62 is, for example, a silicon substrate. Unlike the original plate 61 described in FIGS. 3A to 3E, the original plate 62 is not provided with the pedestal portion 3. The receiver material 36a is, for example, a resin material which crosslinks such as urethane rubber, silicone rubber or acrylate-based rubber. In the state depicted in FIG. 6B, the receiver material 36a is not cured and is a liquid or flowable material.

Figure 6C:
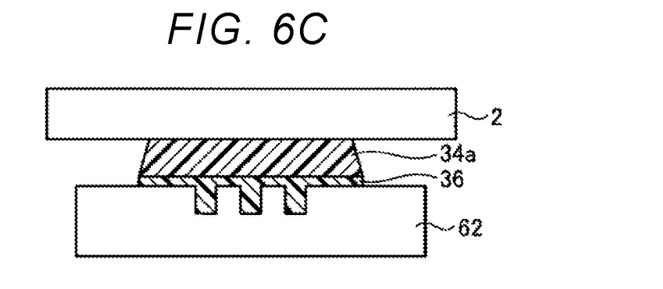

Thereafter, as illustrated in FIG. 6C, the original plate 62 coated with the receiver material 36a is disposed so as to face the embedded portion 34a1, and the receiver material 36a is brought into contact with the embedded portion 34a. In this state, heat or light is applied to the receiver material 36a, and the receiver material 36a is cured and a transfer portion 36 is formed. The transfer portion 36 is bonded to the embedded portion 34a.

Figure 6D:
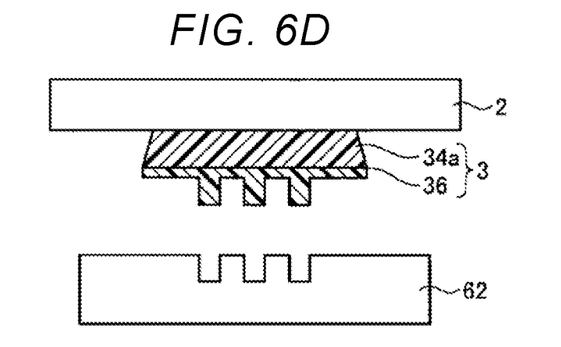

Next, as illustrated in FIG. 6D, the template substrate 2 is separated from the original plate 62. Thereby, the pedestal portion 3 on which the transfer portion 36 is provided is formed. As described above, a template 1 corresponding to that depicted in FIGS. 1A and 1B is completed.

In the third embodiment, it is possible to manufacture the template 1 in which the angle α of the corner portion formed between the first surface 31 and the side surface of the pedestal portion 3 is less than 90 degrees, when the thin transfer portion 36 is discounted. Thereby, the following effect is achieved. That is, it is possible to obtain the template 1 for which the resist will not substantially seep out from the outer periphery portion of the pedestal portion 3 during the template pressing.

Fourth Embodiment

In a fourth embodiment, a method of manufacturing a template having a structure in which a transfer portion formed of a patterned resin is provided on a pedestal portion of a template substrate, will be described.

Figure 7:
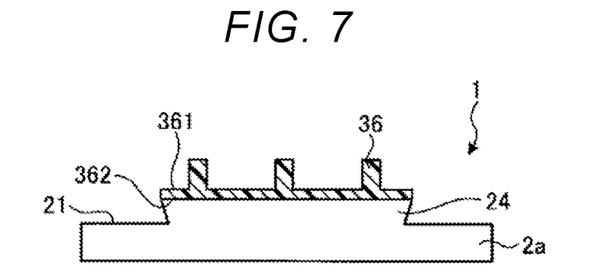
FIG. 7 is a cross-sectional view schematically illustrating an example of a template according to a fourth embodiment.

FIG. 7 is a sectional view schematically illustrating an example of a configuration of a template 1 according to the fourth embodiment. The template 1 according to the fourth embodiment includes a template substrate 2a and the transfer portion 36. The template substrate 2a has a configuration in which a pedestal portion 24 is provided near a central portion of the first surface 21 of a rectangular substrate. The pedestal portion 24 has a structure protruding by approximately 10 to 50 μm with respect of the rest of the template substrate 2a. In performing this process, an angle formed between the side surface and a surface on a side where the transfer portion 36 of the pedestal portion 24 is disposed is not limited to an angle illustrated in FIG. 7. The angle of the pedestal portion 24 may be greater than or equal to, for example, 90 degrees. However, it is also possible to obtain the effect described in the first embodiment by setting the angle of the pedestal portion 24 to be less than 90 degrees. The template substrate 2a is formed of quartz glass or the like.

The transfer portion 36 has a pattern of protrusions and recesses on the first surface 361 and forms the patterned portion of template 1. The second surface 362 opposite to the first surface 361 adheres onto the pedestal portion 24 of the template substrate 2a. As illustrated in FIG. 1A, the pattern arrangement region $R_p$, of a rectangular shape, and the mark arrangement region $R_M$, of a frame shape surrounding the pattern arrangement region $R_p$, are provided on the first surface 361. A pattern disposed in the pattern arrangement region $R_p$ and a mark disposed in the mark arrangement region $R_M$ are substantially the same as the pattern and the mark described in conjunction with the first embodiment. The transfer portion 36 is formed of a flowable material including a reactive group for purposes of curing/hardening the material. The material may be a photo-initiated radical polymerizable material including at least one reactive group selected from an acryloyl group, a methacryloyl group, or a vinyl ether group, or a photo-initiated cationic polymerizable material including at least one reactive group selected from an epoxy group or an oxetanyl group is exemplified as a reactive group for curing.

Figure 8A:
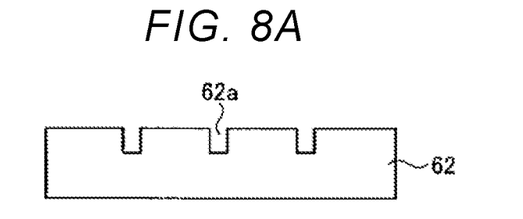
FIGS. 8A to 8D illustrate aspects of a sequence of a manufacturing method of a template according to a fourth embodiment.

FIGS. 8A to 8D are cross-sectional views schematically illustrating an example of a sequence for a manufacturing a template 1 according to the fourth embodiment. First, as illustrated in FIG. 8A, an original plate 62 having a pattern etched therein corresponding to that to be formed on the template 1 is prepared. The original plate 62 is provided with a plurality of recess portions 62a. The original plate 62 is, for example, a silicon substrate.

Figure 8B:
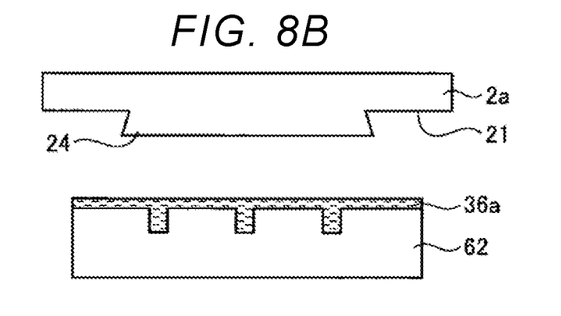

Next, as illustrated in FIG. 8B, a receiver material 36a that is a liquid is formed on the original plate by using a spin coating method. The receiver material 36a is filled in the recess portions 62a and a thickness of the receiver material 36a above the pattern formation surface of the original plate is substantially uniformized. A photo-curing resin or the like can be used as the receiver material 36a.

Thereafter, the template substrate 2a is disposed such that the pedestal portion 24 faces the receiver material 36a on the original plate 62. The template substrate 2a is formed of quartz glass or the like and is provided with the pedestal portion 24 having a height of approximately 10 to 50 μm positioned near a central portion of the first surface 21.

Figure 8C:
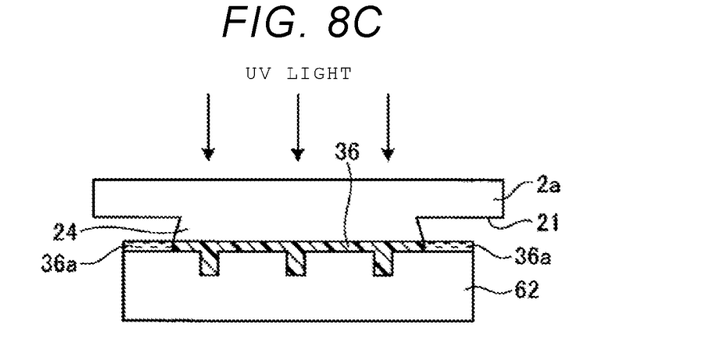

Next, as illustrated in FIG. 8C, the template substrate 2a is brought into contact with the receiver material 36a. Thereafter, the receiver material 36a in contact with the pedestal portion 24 is irradiated with ultraviolet rays. Thereby, the receiver material 36a in the region irradiated with the ultraviolet rays is cured to form the solidified, cured transfer portion 36, but the receiver material 36a in the regions not irradiated with the ultraviolet rays remains in a liquid, uncured form.

Figure 8D:
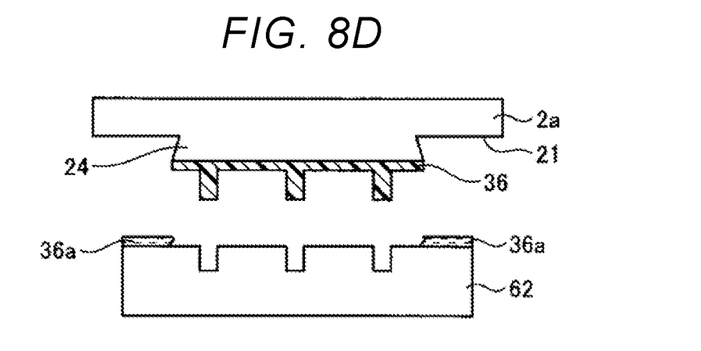

Next, as illustrated in FIG. 8D, the template substrate 2a is separated from the original plate 62. The transfer portion 36 (cured receiver material 36a) is peeled from the original plate 62 and the uncured receiver material 36a remains on the original plate 62. It is noted that the internal breaking strength (modulus) of the transfer portion 36 is preferable to be greater than or equal to $1.2 \times 10^{-4}$ GPa. This is because, when the template 1 is peeled from the resist in the imprint processing, the transfer portion 36 might be broken unless the transfer portion has a breaking stress greater than or equal to $1.2 \times 10^{-4}$ GPa.

Figure 9A:
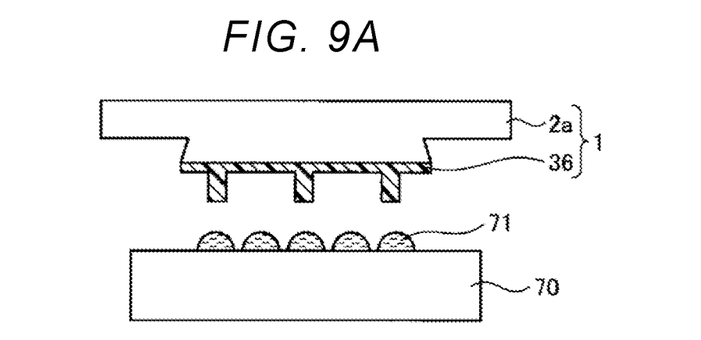
FIGS. 9A to 9D illustrate aspects of a sequence of a semiconductor device manufacturing method including a template according to a fourth embodiment.

FIGS. 9A to 9D are cross-sectional views schematically illustrating an example of a sequence of a method of manufacturing a semiconductor device using a template 1 according to the fourth embodiment. First, as illustrated in FIG. 9A, a resist 71 is dispense onto a particular die or shot region of a workpiece 70. The resist 71 is, for example, a photo-curing resin. The resist 71 is dispensed onto the workpiece 70 by using, for example, an inkjet method. Alternatively, the resist 71 may be entirely coated over the workpiece 70 by using the spin coating method. The workpiece 70 is a semiconductor substrate such as a silicon substrate, a semiconductor film formed over a semiconductor substrate, a conductive film, or an insulating film. Next, in a state where the transfer portion 36 of the template 1 faces the workpiece 70, rough positioning (coarse alignment) between the template 1 and the workpiece 70 is performed.

Figure 9B:
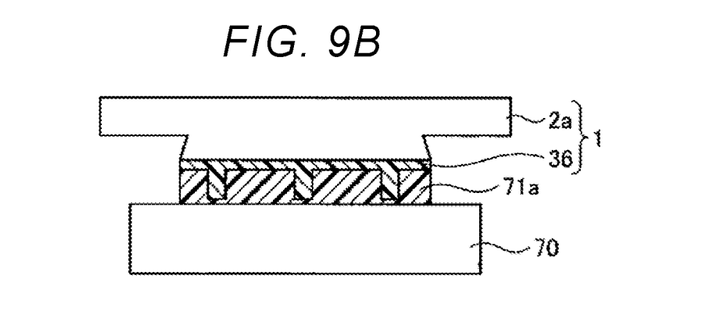

Thereafter, as illustrated in FIG. 9B, at least one of the template 1 and the workpiece 70 is moved until the transfer portion 36 comes into contact with the resist 71. Then, more precise positioning (fine alignment) between the template 1 and the workpiece 70 is performed. After the resist 71 is filled in recess portions of the template 1, the resist 71 is irradiated with ultraviolet rays to cure the resist 71. Thereby, a resist pattern 71a is formed.

Figure 9C:
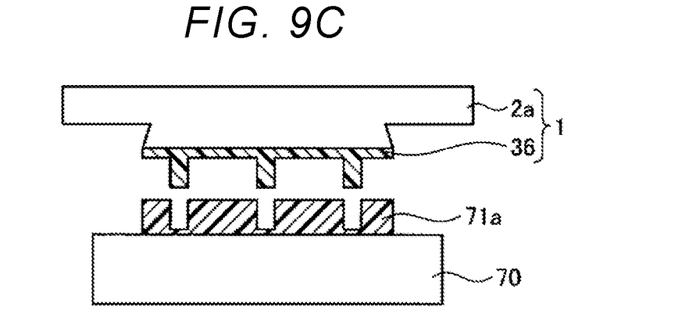

Next, as illustrated in FIG. 9C, the template 1 is separated from the resist pattern 71a. Thereafter, the workpiece 70 is processed by using anisotropic etching, such as reactive ion etching (RIE), using the resist pattern 71a as a mask. By repeating this processing, the workpiece 70 can be processed to have a desired pattern, and a semiconductor device having the desired pattern is thereby manufactured.

Figure 9D:
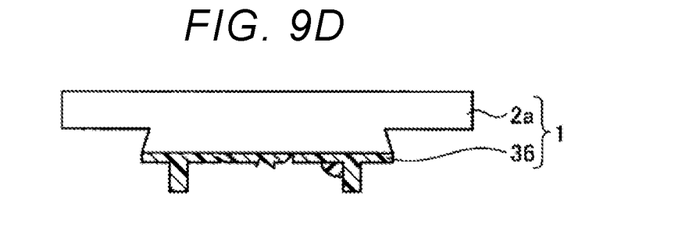

Here, if a processing is repeated in which the template 1 is pressed against the resist 71 on the workpiece 70 many times and the resist 71 is separated from the resist pattern 71a after being cured, the pattern of the transfer portion 36 might eventually be damaged as illustrated in FIG. 9D. If the imprint processing is performed by using a damaged template 1 (see FIG. 9D), the intended resist pattern 71a is no longer able to be formed on the workpiece 70. In such a case, the damaged transfer portion 36 must be removed and a new transfer portion 36 formed on the pedestal portion 24 of the template substrate 2a, and thereby, the template 1 can be more easily reproduced or repaired.

Figure 10A:
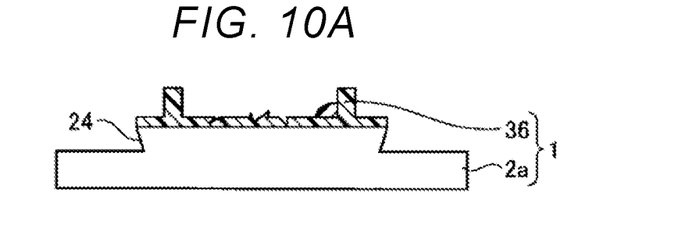
FIGS. 10A and 10B are cross-sectional views schematically illustrating a reproduction sequence of a template according to a fourth embodiment.
Figure 10B:
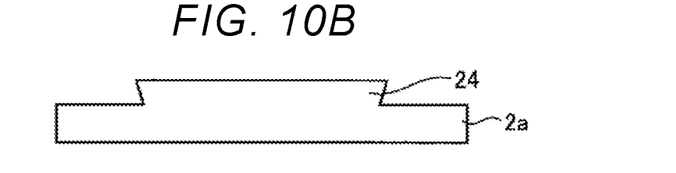

FIGS. 10A and 10B are cross-sectional views schematically illustrating an example of a sequence for repairing the template 1 according to the fourth embodiment. First, as illustrated in FIG. 10A, the damaged transfer portion 36 of the template 1 is peeled or otherwise removed by a cleaning process. For example, a sulfuric acid hydrogen peroxide solution (sometimes referred to as piranha etch) can be used as a cleaning solution, but the cleaning solution may be appropriately changed depending on the material of the transfer portion 36. Thereby, the template substrate 2a in which an upper portion of the pedestal portion 24 has been cleaned is obtained as illustrated in FIG. 10B.

Thereafter, in substantially the same manner as in the method illustrated in FIGS. 8A to 8D, the template 1 is reproduced by forming a new transfer portion 36 on the pedestal portion 24 of the template substrate 2a. The remade template 1 can then be used for manufacturing semiconductor devices as illustrated in FIGS. 9A to 9D.

In the fourth embodiment, imprint processing is performed by using the template 1 in which the resin transfer portion 36 having a pattern adheres onto the pedestal portion 24. When the transfer portion 36 is damaged, the transfer portion 36 can be removed and a new transfer portion 36 can be formed on the pedestal portion 24. When a template formed entirely of quartz glass is damaged, the entire template must be discarded, but in the fourth embodiment, the template 1 can be re-manufactured at a low cost, compared to the manufacturing cost of a quartz glass template since generally, the template substrate 2a is not damaged and can thus be reused after only a relatively simple cleaning process.

In addition, after an upper portion of the original plate 62 is coated with the receiver material 36a by using the spin coating method, the receiver material 36a in contact with the template substrate 2a is cured. Accordingly, a film thickness of the transfer portion 36 formed on the pedestal portion 24 of the template substrate 2a can be substantially uniformized.

Fifth Embodiment

In the template manufacturing method according to the fourth embodiment, after a receiver material is cured in a state of being in contact with a template substrate and the template substrate is separated from the original plate, occasionally the cured receiver material might not adhere to the template substrate and thus might remain on the original plate sometimes. In the fifth embodiment, a method of avoiding such a case will be described.

Figure 11:
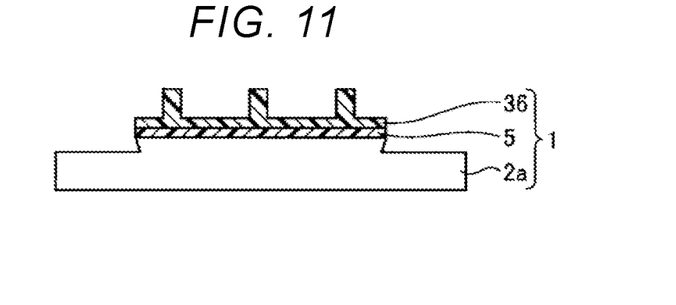
FIG. 11 is a cross-sectional view schematically illustrating a template according to a fifth embodiment.

FIG. 11 is a sectional view schematically illustrating an example of a template according to the fifth embodiment. The template 1 further includes an adhesion layer 5 between the template substrate 2a and the transfer portion 36. A material having an adhesion strength towards the transfer portion 36 that is larger than the adhesion strength between the transfer portion 36 and the original plate 62 is used as the adhesion layer 5.

The adhesion layer 5 can provide improved adhesion strength by incorporating a material providing hydrogen bonding to the relevant surfaces/materials and/or covalent bonding linkages between the template substrate 2a and the transfer portion 36. In an example, adhesion layer 5 is formed of a material having a reactive group that bonds with the transfer portion 36 and a reactive group bonds with the template substrate 2a. As described in the fourth embodiment, the transfer portion 36 also requires a reactive group for curing. For example, in a case where the transfer portion 36 has a photo radical polymerizable group, the photo radical polymerizable group may also be the reactive group for bonding with the transfer portion 36. The material containing a photo radical polymerizable group contains at least one reactive group selected from an acryloyl group, a methacryloyl group, and a vinyl ether group. In addition, in a case where the transfer portion 36 contains a photo cationic polymerizable group, the photo cationic polymerizable group may also be the reactive group for bonding with the transfer portion 36. The material containing a photo cationic polymerizable group contains at least one reactive group selected from an epoxy group and an oxetanyl group.

In a case where the template substrate 2a is formed of quartz glass, a silane coupling agent can be used as a reactive group for bonding with the template substrate 2a. Monoalkoxysilanes, dialkoxysilanes, trialkoxysilanes, monochlorosilanes, dichlorosilanes, trichlorosilanes, and the like can be used as the silane coupling agent. Accordingly, for example, a silane coupling agent also containing a photo radical polymerizable group, a silane coupling agent also containing a photo cationic polymerizable group, or the like can be used as the adhesion layer 5.

3-(Trimethoxysilyl)propyl acrylate, 3-[diethoxy(methyl)silyl]propyl methacrylate, 3-(trimethoxysilyl)propyl methacrylate, 3-[tris(trimethylsilyloxy)silyl]propyl methacrylate, 3-[Dimethoxy(methyl)silyl]propyl methacrylate, 3-(methoxydimethylsilyl)propyl acrylate, 3-(triethoxysilyl)propyl methacrylate, 3-(triallylsilyl)propyl acrylate, 3-(triallylsilyl)propyl methacrylate, diethoxy(3-glycidyloxypropyl)methylsilane, 3-glycidyloxypropyltrimethoxysilane, 3-glycidyloxypropyl(dimethoxy)methylsilane, [8-(glycidyloxy)-n-octyl]trimethoxysilane, triethoxy(3-glycidyloxypropyl)silane, and the like can be used as the adhesion layer 5 in various example embodiments.

Figure 12:
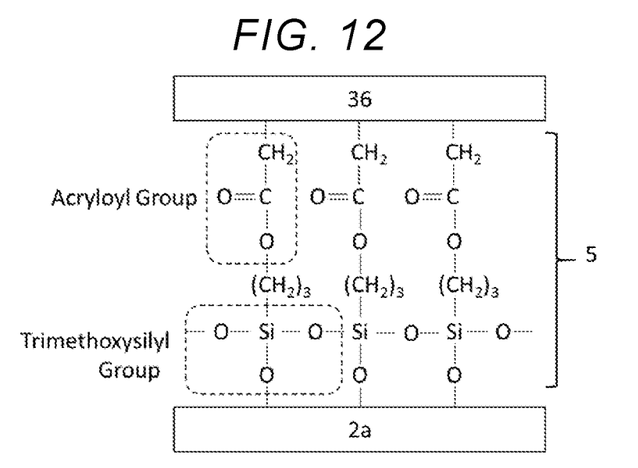
FIG. 12 is a diagram schematically illustrating aspects related to an adhesion layer and a template according to a fifth embodiment.

FIG. 12 is a diagram schematically illustrating a role of the adhesion layer in the template 1 according to the fifth embodiment. Here, a case where 3-(trimethoxysilyl)propyl acrylate is used as the adhesion layer 5 is taken as an example. As illustrated in FIG. 12, a trimethoxysilyl group of the adhesion layer 5 bonds to the template substrate 2a formed of quartz glass by a silane coupling reaction. The acryloyl group of the adhesion layer 5 bonds to the transfer portion 36 in the photo polymerization reaction used for curing of the transfer portion 36. As such, the adhesion layer 5 can make the template substrate 2a more firmly adhere to the transfer portion 36.

If the acryloyl group is switched to an epoxy group, which is a photo cationic polymerizable group, the epoxy group bonds to the transfer portion 36 by a photo cationic polymerization reaction during curing of the transfer portion 36.

FIGS. 13A to 13E are cross-sectional view schematically illustrating an example of a sequence of a manufacturing method of a template 1 according to the fifth embodiment. Here, a case where the adhesion layer 5 and the receiver material 36a are configured with a material containing a photo radical polymerizable group will be described as an example.

Figure 13A:
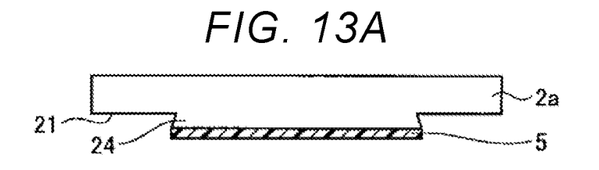
FIGS. 13A to 13E illustrate aspects of a sequence of a manufacturing method of a template according to a fifth embodiment.

First, as illustrated in FIG. 13A, the adhesion layer 5 is formed on the pedestal portion 24 of the template substrate 2a by using a film formation method such as a vapor deposition method. Here, 3-(trimethoxysilyl)propyl acrylate is used for the adhesion layer 5, the trimethoxysilyl group bonds to the template substrate 2a, which is formed of quartz glass, through a silane coupling reaction during the vapor deposition process, and thereby, the adhesion layer 5 is formed.

Figure 13B:
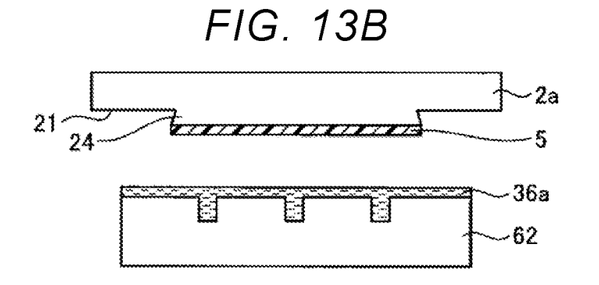

Next, as illustrated in FIG. 13B, the original plate 62 is prepared, and the receiver material 36a is formed on the entire surface of the original plate 62 by using the spin coating method.

Figure 13C:
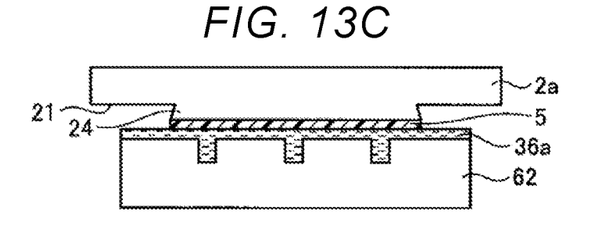

Thereafter, the template substrate 2a is disposed such that the pedestal portion 24 faces the receiver material 36a on the original plate 62. Next, as illustrated in FIG. 13C, the template substrate 2a and the receiver material 36a are brought into contact. However, unlike the case of FIG. 8C, the receiver material 36a is brought into direct contact with the adhesion layer 5 formed on the pedestal portion 24 instead of the pedestal portion 24. During this contacting process, the template substrate 2a and the original plate 62 are disposed in an atmosphere in which the curing reaction is inhibited. That is, in a case where the receiver material 36a containing a photo radical polymerizable group is used, the atmosphere contains oxygen.

Figure 13D:
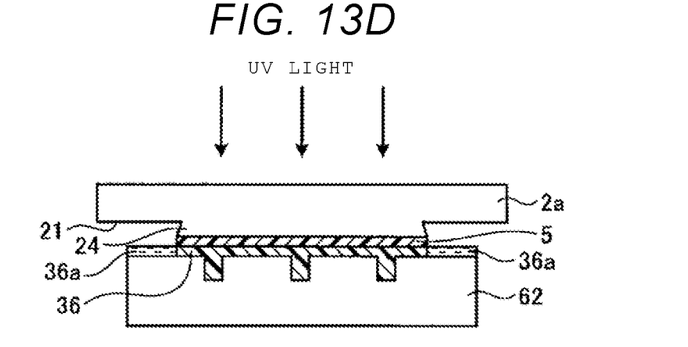

Thereafter, as illustrated in FIG. 13D, a region including the pedestal portion 24 is irradiated with ultraviolet rays. By doing so, the adhesion layer 5 and the receiver material 36a are bonded to each other by the photo radical polymerization reaction and are cured in the irradiated region where the adhesion layer 5 and the receiver material 36a are in contact with each other. As a result, the receiver material 36a becomes the transfer portion 36. It is preferable that only a region corresponding to the pedestal portion 24 is irradiated with ultraviolet rays, but generally a wider region than the region exactly corresponding to the pedestal portion 24 will usually be irradiated with the ultraviolet rays. Since the pedestal portion 24 protrudes from the first surface 21 of the template substrate 2a, a periphery of the pedestal portion 24 is filled in an atmosphere containing oxygen. In an oxygen rich atmosphere, a photo radical polymerizable curing reaction will not substantially progress and the receiver material 36a exposed to the oxygen rich atmosphere during irradiation is hardly solidified, and thus, even if some periphery of the pedestal portion 24 is irradiated with ultraviolet rays, the receiver material 36a disposed beyond the pedestal portion 254 will not be substantially cured and therefor remains in a liquid form in those regions which are not in direct contact with the adhesion layer 5.

Figure 13E:
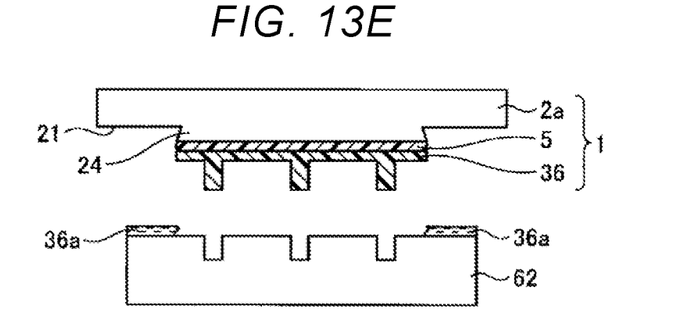

Next, as illustrated in FIG. 13E, the template substrate 2a is separated from the original plate 62. The transfer portion 36 is peeled not from the template substrate 2a but from a boundary with the original plate 62 without being broken. In addition, since the receiver material 36a is not cured in regions other than the region corresponding to the pedestal portion 24 of the template substrate 2a, the breaking stress of the transfer portion 36 in the region corresponding to the pedestal portion 24 is larger than the breaking stress of the receiver material 36a in the regions other than the region corresponding to the pedestal portion 24. Accordingly, when being separated, the transfer portion 36 is cleanly peeled at a boundary between the region corresponding to the pedestal portion 24 and the other regions.

The adhesion layer 5 and the receiver material 36a can be configured with a material containing a photo cationic polymerizable group. In such cases, when these materials are in an atmosphere including water vapor, the photo cationic polymerization curing reaction will be inhibited (similarly to inhibition of the radical polymerization curing reaction by the presence of oxygen). Accordingly, in a case where the adhesion layer 5 and the receiver material 36a are configured with a material containing a photo cationic polymerizable group, the template substrate 2a and the original plate 62 are disposed in an atmosphere containing water vapor before the ultraviolet rays are applied in FIG. 13D. By doing so, the adhesion layer 5 and the receiver material 36a are bonded to each other and cured by photo cationic polymerization reaction in the region where the adhesion layer 5 and the receiver material 36a are in contact with each other. In the other regions where the receiver material 36a is not in contact with the adhesion layer 5, the receiver material 36a is not cured due to inhibition by water vapor and thus remains in a liquid form.

The same effect as in the fourth embodiment can also be obtained in the fifth embodiment.

Sixth Embodiment

Figure 14:
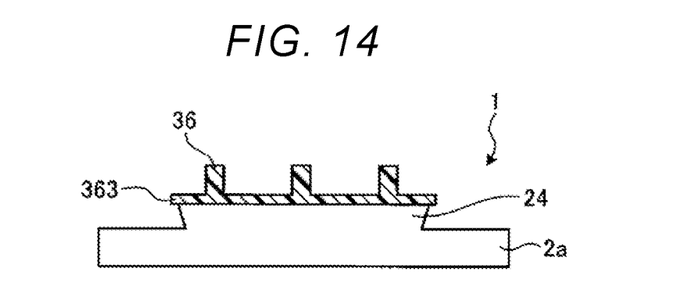
FIG. 14 is a cross-sectional view schematically illustrating a template manufactured by a method described in conjunction with a fourth embodiment.

FIG. 14 is a cross-sectional view schematically illustrating an example of a template manufactured by using the method described in the fourth embodiment. As illustrated in FIG. 14, the transfer portion 36 is provided on the pedestal portion 24 of the template substrate 2a; however, a peripheral edge portion of the transfer portion 36 in contact with the pedestal portion 24 may occasionally be formed having an unintended, irregular shape. For example, a portion 363 of the peripheral edge portion of the transfer portion 36 may protrude more in a lateral direction than an outer edge of the pedestal portion 24. If the imprint processing is performed by using such a template, there is a possibility that the portion protruding in the lateral direction would interfere with a resist pattern formed or to be formed in an adjacent shot or die region. In addition, the same problem may occur with the fifth embodiment. In the sixth embodiment, a method of manufacturing a template that can prevent such a problem from occurring will be described.

Figure 15A:
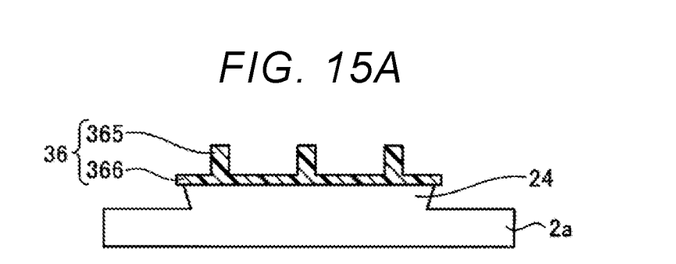
FIGS. 15A and 15B are cross-sectional views schematically illustrating aspects of a sequence of a manufacturing method of a template according to a sixth embodiment.
Figure 15B:
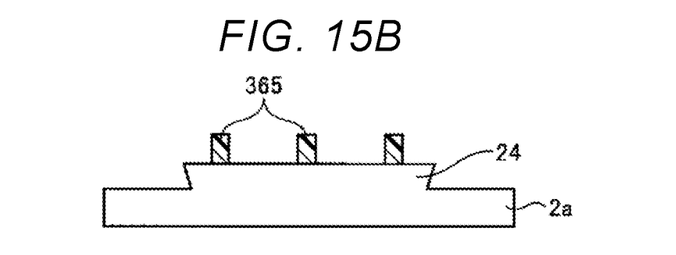

FIGS. 15A and 15B are cross-sectional views schematically illustrating an example of a sequence of a template manufacturing method according to the sixth embodiment. FIG. 15A illustrates the template 1 after separation from the original plate 62 as in FIG. 8D. As illustrated in FIG. 15A, the transfer portion 36 includes a convex portion (convex pattern) 365 and a residual film portion 366 having a substantially uniform thickness on the pedestal portion 24 of the template substrate 2a. A recess portion (recess pattern) is a region surrounded by or between the convex portion 365. As illustrated in FIG. 14, a peripheral edge portion of the residual film portion 366 may occasionally protrude outside of the pedestal portion 24.

As illustrated in FIG. 15B, an etch-back process is performed by anisotropic dry etching, such as a RIE method, until exposed portions of the residual film portion 366 are removed.

It is noted that a case corresponding to the fourth embodiment is described as an example here, but both exposed portions of the residual film portion 366 and the adhesion layer 5 (present as in the fifth embodiment) can be removed in the etch-back process.

Likewise, in the sixth embodiment, the receiver material 36a is cured, the template substrate 2a is separated from the original plate 62, and thereafter, the exposed portions of the residual film portion 366 can be removed by anisotropic etching. By doing so, it is possible to prevent the peripheral edge portion of the residual film portion 366 from protruding in the lateral direction and interfering with a resist pattern formed or to be formed in the adjacent regions.

While certain embodiments have been described, these embodiments have been presented by way of examples only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A template for imprint patterning processes, comprising:
   a template substrate having a first surface; and
   a pedestal on the first surface of the template substrate, the pedestal having a second surface spaced from the first surface in a first direction perpendicular to the first surface, and a pattern disposed on the second surface, wherein
   the pedestal has a sidewall between the first surface and the second surface that is at an angle of less than 90° to the second surface, and
   the sidewall comprises a first portion that meets the second surface at the angle and a second portion that extends from the first portion towards the first surface at a second angle different from the angle.

2. The template according to claim 1, wherein the angle is greater than or equal to 30 degrees and less than or equal to 45 degrees.

3. The template according to claim 1, wherein
   the pattern is disposed in a pattern arrangement region in a central portion of the second surface surrounded on the second surface by a mark arrangement region outside the pattern arrangement region between the central portion and an outer edge of the second surface, and
   the pattern arrangement region does not extend laterally along the second surface beyond an outermost position of a projected outline of a direct contact region between the pedestal and the first surface.

4. The template according to claim 1, wherein the pedestal is a resin material.

5. The template according to claim 1, wherein the pedestal and the template substrate are formed of the same material.

6. The template according to claim 5, wherein the pattern is formed in a resin material disposed on the pedestal.

7. The template according to claim 6, further comprising:
   an adhesion layer between the resin material and the pedestal.

8. The template according to claim 7, wherein the adhesion layer comprises at least one of 3-(trimethoxysilyl)propyl acrylate, 3-[diethoxy(methyl)silyl]propyl methacrylate, 3-(trimethoxysilyl)propyl methacrylate, 3-[tris(trimethylsilyloxy)silyl]propyl methacrylate, 3-[Dimethoxy(methyl)silyl]propyl methacrylate, 3-(methoxydimethylsilyl)propyl acrylate, 3-(triethoxysilyl)propyl methacrylate, 3-(triallylsilyl)propyl acrylate, 3-(triallylsilyl)propyl methacrylate, diethoxy(3-glycidyloxypropyl)methylsilane, 3-glycidyloxypropyltrimethoxysilane, 3-glycidyloxypropyl(dimethoxy)methylsilane, and [8-(glycidyloxy)-n-octyl]trimethoxysilane, triethoxy(3-glycidyloxypropyl)silane.

9. The template according to claim 1, wherein the second angle is substantially 90° and the second portion meets the first surface at the second angle.

10. The template according to claim 1, wherein the pedestal is a first resin material and the pattern is formed in a second resin material disposed on the first resin material.

11. The template according to claim 1, wherein
    the pedestal is a first resin material, and
    the pattern is a second resin material, different from the first resin material, disposed on the first resin material.

12. The template according to claim 1, wherein the pedestal is a resin material.

13. A method of manufacturing a semiconductor device, comprising:
    preparing a template comprising:
        a template substrate having a first surface; and
        a pedestal on the first surface of the template substrate, the pedestal having a second surface spaced from the first surface in a first direction perpendicular to the first surface, and a pattern disposed on the second surface, wherein
    the pedestal has a sidewall between the first surface and the second surface that is at an angle of less than 90° to the second surface, and
    the sidewall comprises a first portion that meets the second surface at the angle and a second portion that extends from the first portion towards the first surface at a second angle different from the angle;
    depositing a resist material on a semiconductor substrate;
    placing the template pattern and the resist material in contact;
    curing the resist material while in contact with the template; and
    separating the template from the resist material after curing.

14. The method of claim 13, wherein the angle is greater than or equal to 30 degrees and less than or equal to 45 degrees.

15. The method of claim 13, wherein
    the pattern is disposed in a pattern arrangement region in a central portion of the second surface surrounded on the second surface by a mark arrangement region outside the pattern arrangement region between the central portion and an outer edge of the second surface, and
    the pattern arrangement region does not extend laterally along the second surface beyond an outermost position of a projected outline of a direct contact region between the pedestal and the first surface.

16. The method of claim 13, wherein the pedestal is a resin material.

* * * * *